United States Patent [19]
Holm et al.

[11] Patent Number: 5,625,201
[45] Date of Patent: Apr. 29, 1997

[54] MULTIWAVELENGTH LED DEVICES AND METHODS OF FABRICATION

[75] Inventors: Paige M. Holm, Phoenix; Benjamin W. Gable, Chandler, both of Ariz.

[73] Assignee: Motorola, Schaumburg, Ill.

[21] Appl. No.: 354,193

[22] Filed: Dec. 12, 1994

[51] Int. Cl.$^6$ ............................................. H01L 33/00
[52] U.S. Cl. ............................. 257/88; 257/90; 257/97; 257/99
[58] Field of Search ................... 257/13, 81, 88, 257/89, 90, 94, 96, 97, 99

[56] References Cited

U.S. PATENT DOCUMENTS

| | | | |
|---|---|---|---|
| 4,577,207 | 3/1986 | Copeland | 257/90 |
| 4,987,097 | 1/1991 | Nitta et al. | 437/129 |
| 5,075,743 | 12/1991 | Behfar-Rad | 257/89 |
| 5,235,194 | 8/1993 | Izumiya et al. | 257/13 |
| 5,467,215 | 11/1995 | Lebby et al. | 359/247 |
| 5,483,085 | 1/1996 | Holm et al. | 257/88 |

FOREIGN PATENT DOCUMENTS

| | | | |
|---|---|---|---|
| 54-107289 | 8/1979 | Japan | 257/90 |
| 56-126985 | 10/1981 | Japan | 257/90 |
| 58-103182 | 6/1983 | Japan | 257/89 |
| 59-58877 | 4/1984 | Japan | 257/89 |
| 63-73679 | 4/1988 | Japan | 257/89 |
| 2-283079 | 11/1990 | Japan | 257/89 |
| 3-171679 | 7/1991 | Japan | 257/97 |
| 5-275746 | 10/1993 | Japan | 257/97 |
| 6-53550 | 2/1994 | Japan | 257/90 |

*Primary Examiner*—Donald L. Monin, Jr.
*Attorney, Agent, or Firm*—Eugene A. Parsons

[57] ABSTRACT

A multiwavelength LED device including a first LED constructed to emit light of a first wavelength and a second LED constructed to emit light of a second wavelength, different than the first wavelength. The first and second LEDs are stacked vertically on a substrate and positioned to both emit light in the same direction. One of the LEDs is transparent to light emitted by the other of the LEDs so that light from both LEDs is emitted through a single aperture and can be mixed in intensity to produce a variety of wavelengths. The LEDs are individually addressable.

16 Claims, 4 Drawing Sheets

MULTIWAVELENGTH LED DEVICES AND METHODS OF FABRICATION

FIELD OF THE INVENTION

The present invention pertains to light emitting diode (LED) devices and more specifically to LED devices capable of emitting multiwavelength light.

BACKGROUND OF THE INVENTION

At the present time, because of the surge in communication and visual devices, there are many applications for image manifestation apparatus. In particular, there is a real need for image manifestation apparatus capable of producing images in a variety of colors and, in many applications, in full color.

Generally, two types of light emitting diodes are known: the edge emitting diode, which is utilized almost exclusively in conjunction with fiber optics; and surface emitting diodes.

In the prior art, the surface emitting, light emitting diodes (LED) are popular devices utilized for emitting light to produce images. Surface emitting LEDs require a very small area (5–50 μms) and are relatively easy to fabricate. Thus, surface emitting LEDs can be fabricated in large addressable arrays so that complete images can be generated by a single array.

One problem with surface emitting LEDs is the fact that they are a one predominant wavelength device. Thus, in the prior art in order to produce color images, each pixel of the image includes a plurality of LEDs, each producing a different wavelength of light. In an ideal full color device, for example, red, green and blue LEDs are grouped in each pixel, and the three LEDs have independently controlled intensities so the emitted light can be mixed and appears to produce true color. Such pixels require three times the surface area and three times the controls of a single LED.

Thus, it would be highly desirable to devise a multiwavelength LED pixel.

It is a purpose of the present invention to provide multiwavelength LED devices.

It is another purpose of the present invention to provide multiwavelength LED devices which produce a variety of wavelengths of light through a single emission aperture.

It is still another purpose of the present invention to provide methods of fabricating multiwavelength LED devices.

SUMMARY OF THE INVENTION

The above problems and others are at least partially solved and the above purposes and others are realized in a multiwavelength LED device including a first LED constructed to emit light of a first wavelength and a second LED constructed to emit light of a second wavelength, different than the first wavelength. The first and second LEDs are stacked vertically and positioned to both emit light in the same direction. One of the LEDs is transparent to light emitted by the other of the LEDs so that light from both LEDs is emitted through a single aperture and can be mixed in intensity to produce a variety of wavelengths. The LEDs are individually addressable through electrically conductive contact layers formed on either side of and between the LEDs.

BRIEF DESCRIPTION OF THE DRAWINGS

Referring to the drawings.

DESCRIPTION OF THE PREFERRED EMBODIMENTS

Figure 1:
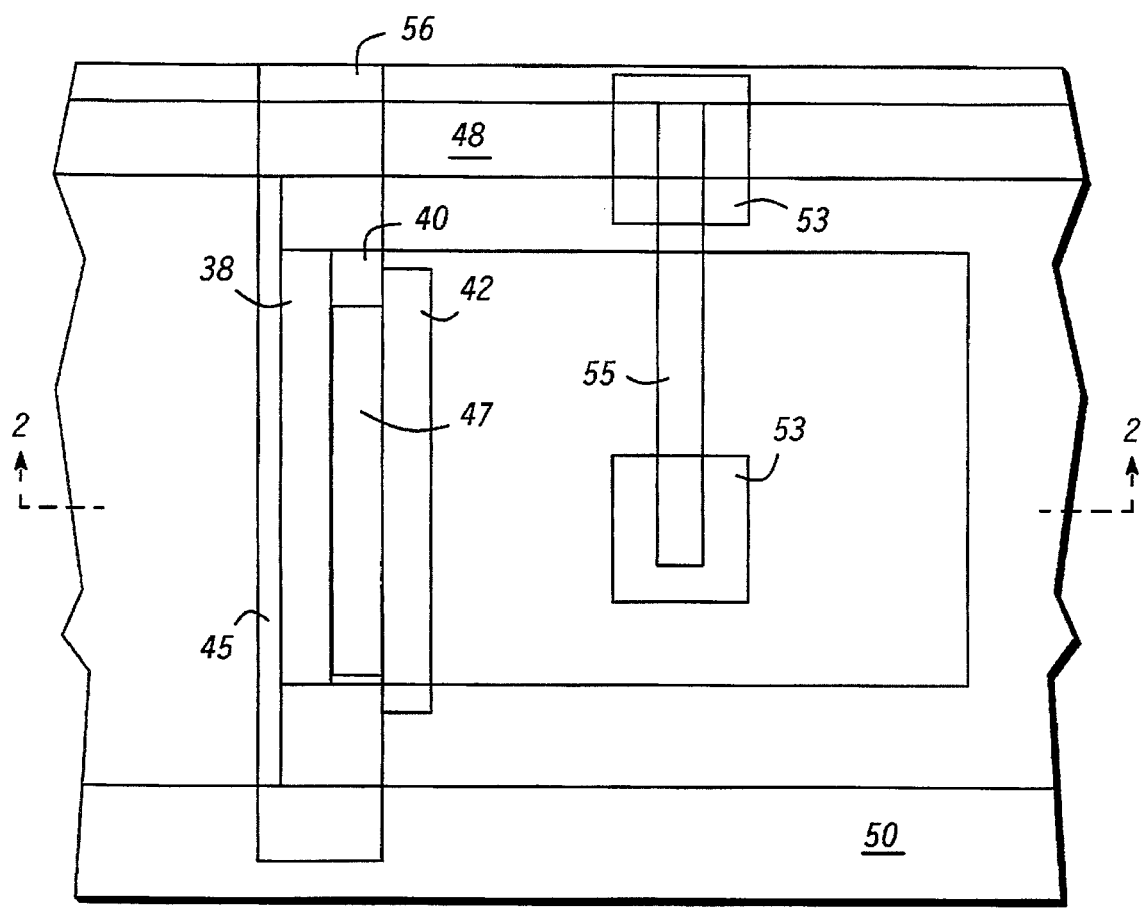
FIG. 1 is a view in top plan of a multiwavelength device incorporating the present invention.
Figure 2:
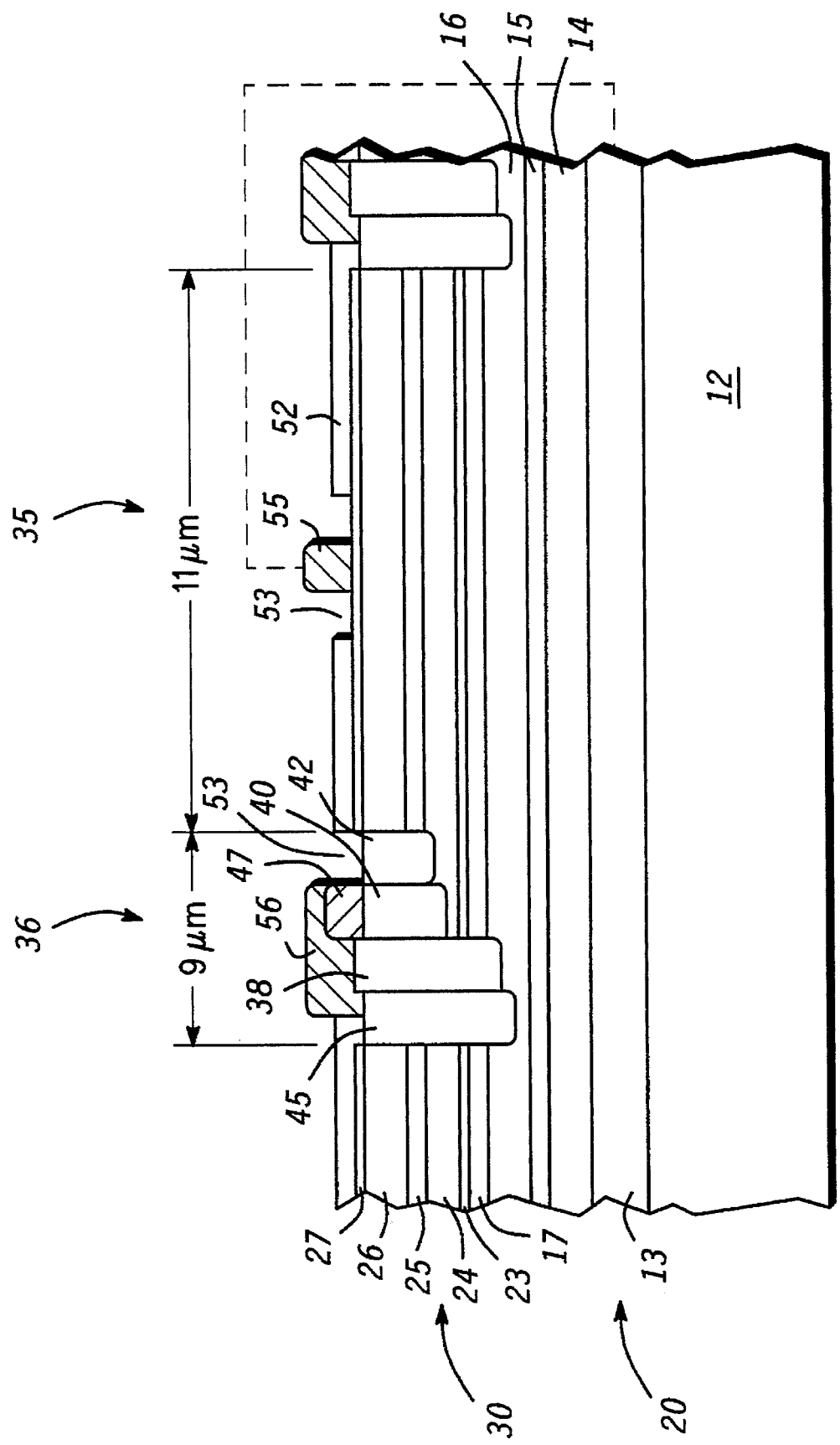
FIG. 2 is a sectional view as seen from the line 2—2 of FIG. 1.

Referring generally to FIGS. 1 and 2, a top plan and a sectional view, respectively, are illustrated of a multiwavelength device 10 incorporating the present invention. As can be seen best by referring to FIG. 2, a substrate 12 is provided having a generally planar upper surface. A contact layer 13 of electrically conductive material is positioned on the planar surface of substrate 12. A confinement layer 14 is positioned on the surface of contact layer 13. An active layer 15 is positioned on the surface of confinement layer 14 and another confinement layer 16 is positioned on the surface of active layer 15. A contact layer 17 of electrically conductive material is positioned on the surface of confinement layer 16 to complete the basic structure for a surface emitting, heterostructure light emitting diode (LED) 20.

A contact layer 23 of electrically conductive material is positioned on the surface of contact layer 17. A confinement layer 24 is positioned on the surface of contact layer 23. An active layer 25 is positioned on the surface of confinement layer 24 and another confinement layer 26 is positioned on the surface of active layer 25. A contact layer 27 of electrically conductive material is positioned on the surface of confinement layer 26 to complete the basic structure for a second surface emitting, heterostructure light emitting diode (LED) 30.

In one embodiment, the various layers are positioned as described above by epitaxially growing the layers sequentially in the order in which they are disposed. In this embodiment, as a specific example, substrate 12 is formed of semi-insulating gallium arsenide (GaAs) and the epitaxially grown layers are in the InGaAlP material system. As a further specific example: contact layer 13 is formed of heavily doped ($>10^{18}$) GaAs with $n^+$ type conductivity; confinement layer 14 is formed of InGaAlP doped for n-type conductivity; active layer 15 is formed of InGaAlP; confinement layer 16 is formed of InGaAlP doped for p-type conductivity; contact layer 17 is formed of heavily doped ($>10^{18}$) GaAs with $p^+$ type conductivity; contact layer 23 is formed of heavily doped ($>10^{18}$) GaAs with $n^+$ type conductivity; confinement layer 24 is formed of InAlP doped for n-type conductivity; active layer 25 is formed of InGaAlP; confinement layer 26 is formed of InAlP (or InGaAlP with 0% Ga) doped for p-type conductivity; and contact layer 27 is formed of heavily doped ($>10^{18}$) GaAs with $p^+$ type conductivity.

In this further specific example, heterostructure LED 30 is constructed to emit at shorter wavelengths, e.g. green light in a 565 nm range, and heterostructure LED 20 is constructed to emit at longer wavelengths, e.g. red light in a 645 nm range. Since LED 30 is constructed to emit shorter wavelength light, active layer 25 and confinement layers 24 and 26 are substantially transparent to light emitted by LED 20. Further, by forming contact layers 17 and 23 of relatively thin, heavily doped material, they are also transparent to light emitted by LED 30. Thus, multiwavelength device 10 is constructed with a single aperture or light emitting area 35 and light from LED 30 and from LED 20 is emitted through light emitting area 35.

A specific method of fabricating an array of multiwavelength devices 10 includes the following steps. First, a substrate with a planar surface is provided. Then a plurality of layers of material are sequentially, epitaxially formed, including layers 13–17 and layers 23–27. As a typical example, confinement layers 24 and 26 are formed of InAlP and active layer 25 is formed of InGaAlP with a 50% Al mole fraction for green light emission. It should be understood by those skilled in the art that when referring to a percentage, for example aluminum or gallium, in the present disclosure, the percentage is being expressed in terms of the amount of aluminum relative to the gallium. For example, 50% Al mole fraction would be designated $In(Ga_{1-x}Al_x)P$. Also, 0% Al mole fraction is InGaP and 0% Ga mole fraction is InAlP. Confinement layers 14 and 16 are formed of InGaAlP and active layer 15 is formed of InGaAlP with a 0% Al mole fraction for red light emission. It will of course be understood that other combinations can be devised and that additional LEDs can be incorporated into a single multiwavelength device, if desired.

Light emitting area 35 and an adjacent contact area 36 are defined by masking and etching contact layer 27, or selectively depositing contact layer 27, for each multiwavelength device 10. It should be noted that in this specific embodiment light emitting area 35 is approximately an 11 μm square area and adjacent contact area 36 is approximately 9 μm by 11 μm (see FIG. 1). Also, rows and columns of multiwavelength devices 10 are defined.

Once light emitting area 35 and adjacent contact area 36 for each multiwavelength device 10 is defined, an impurity 38 is implanted generally in the shape of a vertical column through confinement layer 26, active layer 25, confinement layer 24, contact layer 23 and at least in contact with contact layer 17 in adjacent contact area 36 of each multiwavelength device 10. In the embodiment illustrated in FIGS. 1 and 2, impurity 38 extends through contact layer 17 and partially into confinement layer 16 to ensure a good electrical contact with contact layer 17. Impurity 38 provides an external, or surface, electrical connection to contact layer 17 (the anode of LED 20) for each multiwavelength device 10 in the array. In the embodiment being described, since contact layer 17 is the p-type contact for diode 20, implant 38 is any material that will satisfactorily couple contact layer 17 to the surface for external contact such as, for example, ions of Be.

Another impurity 40 is implanted generally in the shape of a vertical column through confinement layer 26, active layer 25, and at least in contact with confinement layer 24 in adjacent contact area 36 of each multiwavelength device 10. Care must be taken to ensure that impurity 40 is not implanted through contact layer 17. In the embodiment illustrated in FIGS. 1 and 2, impurity 40 stops just short of contact layer 23. Once impurity 40 is implanted, an anneal step is performed to activate implants 38 and 40. The anneal step causes the usual spreading and ensures a good electrical contact with contact layer 23, without spreading into layer 17. Impurity 40 provides an external, or surface, electrical connection to contact layer 23 (the cathode of LED 30) for each multiwavelength device 10 in the array. In the embodiment being described, since contact layer 23 is the n-type contact for diode 30, impurity 40 is any material that will satisfactorily couple contact layer 23 to the surface for external contact such as, for example, ions of Si.

A third impurity 42 is implanted through confinement layer 26, active layer 25 and at least into confinement layer 24, but not through contact layer 23, in adjacent contact area 36 between light emitting area 35 and impurity 40 (actually partially in implant 40) of each multiwavelength device 10. Impurity 42 forms an isolating resistive volume between light emitting area 35 and conductive impurities 38 and 40 for each multiwavelength device 10. Thus, impurity 42 isolates LED 30 from the external electrical connections and removes any parasitic p-n junctions that might otherwise form between impurity 40 and the p-type layers of LED 30. In the embodiment being described, impurity 42 is any material that will satisfactorily form an isolating resistive volume for separating or isolating LED 30 from the external contacts such as, for example, ions of H or O.

A fourth impurity 45 is implanted through confinement layer 26, active layer 25, confinement layer 24, contact layers 23 and 17 and at least partially into confinement layer 16 between light emitting area 35 of the adjacent multiwavelength device 10 and impurity 38 (actually partially in impurity 38) of each multiwavelength device 10. Impurity 45 forms an isolating resistive volume between adjacent LEDs 20 in the array of LEDs. Thus, impurity 42 isolates LED 20 and provides pixel confinement for LED 20. In the embodiment being described, impurity 45 is any material that will satisfactorily form an isolating resistive volume for separating or isolating LED 20 such as, for example, ions of H or O.

In this embodiment, a step of etching is performed at the row ends to provide an external electrical contact to contact layer 13 (the cathode of LED 20). In this step the ends of the rows are etched to expose a portion of layer 13 for electrical contact therewith.

Contact 47 with impurity 40 (the cathode of LED 30) and row contacts 48 (see FIG. 1) are formed by any of the well known methods. In general, n-type metal is deposited in rows between adjacent multiwavelength devices 10 to the ends of the rows where, in this embodiment, row contacts 48 are coupled to contact layers 13.

A fifth impurity 50 is deep implanted through all of the epitaxial layers and into substrate 12 adjacent light emitting area 35 to provide row isolation for all multiwavelength devices 10 positioned in rows. Impurity 50 forms an isolating resistive volume between adjacent rows of multiwavelength devices 10. In the embodiment being described, impurity 50 is any material that can be deep implanted and will satisfactorily form an isolating resistive volume such as, for example, ions of H, or high energy O+, or equivalents.

A dielectric layer 52 is then formed or deposited over the upper surface of the entire structure and vias 53 are etched therethrough for p-type contacts and access to the n-type metal. Finally, p-type metallization is deposited using any well known method. The p-type metallization is used to form both p-type contacts 55 to contact layer 27 in light emitting area 35 of each multiwavelength device 10 and column contacts 56. In this specific embodiment, column contacts 56 are in contact with n-type contact 47 and implanted impurity 38 for each multiwavelength device 10 in each column. Thus, the cathode of LED 30 is connected to the anode of LED 20 by column contact 56. Further, one of vias 53 allows contact 55 to electrically couple to row contacts 48 (see FIG. 1) so that the anode of LED 30 is coupled to the cathode of LED 20.

Figure 3:
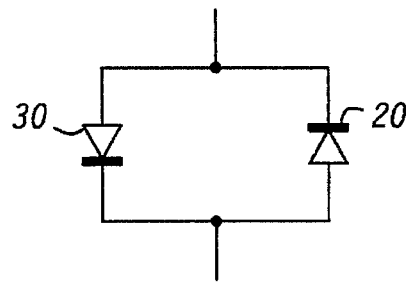
FIG. 3 is a schematic representation of the device of FIG. 1.

The connections described produces a push-pull connection, illustrated schematically in FIG. 3. This push-pull connection of LEDs 20 and 30 of each multiwavelength device 10 provides individual addressability for all of the LEDs while reducing the surface area required by at least one-half. Electrical connections for a push-pull type of LED array are disclosed in a U.S. Pat. No. 5,432,358, entitled "Integrated Electro-optical Package", issued 11 Jul. 1995, and assigned to the same assignee.

Figure 4:
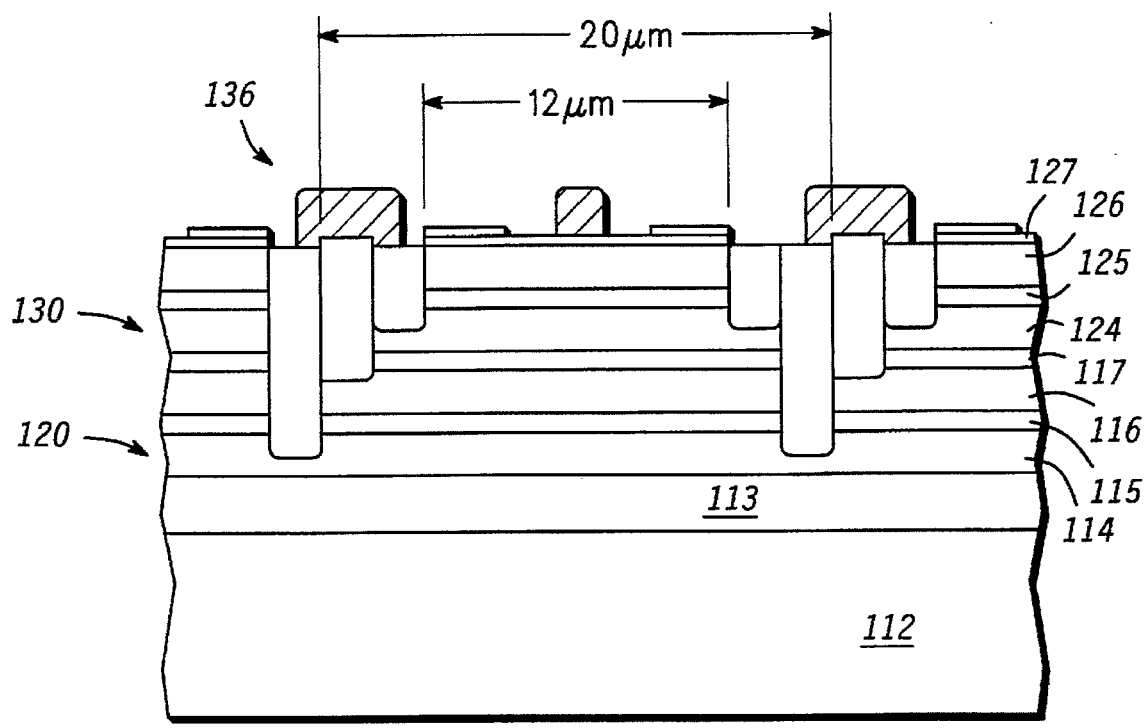
FIG. 4 is a sectional view, similar to FIG. 2, of another embodiment of a multiwavelength device incorporating the present invention.

A different embodiment including a multiwavelength device 110 is illustrated in a sectional view in FIG. 4. It will of course be understood that device 110 can be formed on a wafer in an array of devices or as a single device. A substrate 112 is provided having a generally planar upper surface. A contact layer 113 of electrically conductive material is positioned on the planar surface of substrate 112. A confinement layer 114 is positioned on the surface of contact layer 113. An active layer 115 is positioned on the surface of confinement layer 114 and another confinement layer 116 is positioned on the surface of active layer 115. A contact layer 117 of electrically conductive material is positioned on the surface of confinement layer 116 to complete the basic structure for a surface emitting, heterostructure LED 120.

In this embodiment, contact layer 117 also serves as a contact layer for a second heterostructure LED 130 positioned on LED 120. A confinement layer 124 is positioned on the surface of contact layer 117. An active layer 125 is positioned on the surface of confinement layer 124 and another confinement layer 126 is positioned on the surface of active layer 125. A contact layer 127 of electrically conductive material is positioned on the surface of confinement layer 126 to complete the basic structure for second surface emitting, heterostructure LED 130.

In this embodiment, as a specific example, substrate 112 is formed of semi-insulating gallium arsenide (GaAs) and the epitaxially grown layers are in the InGaAlP material system. For this specific example: contact layer 113 is formed of heavily doped ($>10^{18}$) GaAs with $n^+$ type conductivity; confinement layer 114 is formed of InGaAlP doped for n-type conductivity; active layer 115 is formed of InGaAlP; confinement layer 116 is formed of InGaAlP doped for p-type conductivity; contact layer 117 is formed of heavily doped ($>10^{18}$) GaAs with $p^+$ type conductivity; confinement layer 124 is formed of InAlP doped for p-type conductivity; active layer 125 is formed of InGaAlP; confinement layer 126 is formed of InAlP doped for n-type conductivity; and contact layer 127 is formed of heavily doped ($>10^{18}$) GaAs with $n^+$ type conductivity.

As in the previous method, a light emitting area 135 and an adjacent contact area 136 are defined by masking and etching contact layer 127, or selectively depositing contact layer 127, for each multiwavelength device 110. It should be noted that in this specific embodiment light emitting area 135 is approximately a 12 μm square area and by including adjacent contact area 136 the total square area is approximately 20 μm (see FIG. 4). Also, rows and columns of multiwavelength devices 110 are defined.

Once light emitting area 135 and adjacent contact area 136 for each multiwavelength device 110 are defined, an impurity 138 is implanted generally in the shape of a vertical column through confinement layer 126, active layer 125, confinement layer 124, and at least in contact with contact layer 117 in adjacent contact area 136 of each multiwavelength device 110. Impurity 138 provides an external electrical contact for the common anodes (contact layer 117) of LEDs 120 and 130. In the embodiment being described, since contact layer 117 is the p-type contact for both LED 120 and LED 130, implant 138 can be any material that will satisfactorily couple contact layer 117 to the surface for external contact such as, for example, ions of Be.

Figure 5:
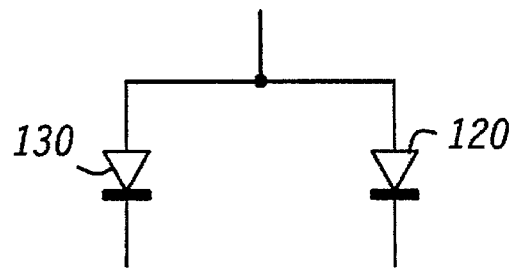
FIG. 5 is a schematic representation of the device of FIG. 4.

The remaining steps of the procedure for fabricating multiwavelength device 110 of FIG. 4 is basically the same as described in conjunction with multiwavelength device 10 of FIG. 1. The major difference is that the step of implanting impurity 40 is not required, since the single contact layer (layer 117) is a common connection for the anodes, and as a result, multiwavelength device 110 is a three terminal device (see schematic diagram of FIG. 5).

One advantage of this specific device and process is that one fewer process steps is required. Because multiwavelength device 110 has a common anode and one cathode for each LED 120 and 130, these devices cannot be driven with the push-pull addressing scheme described above, but are addressed in the usual matrix manner. However, the common anode eliminates half of the I/O requirements along one direction of the array and, thereby, substantially reduces the external connections. Another possible advantage is that both LEDs 120 and 130 can be turned ON at the same time.

Figure 6:
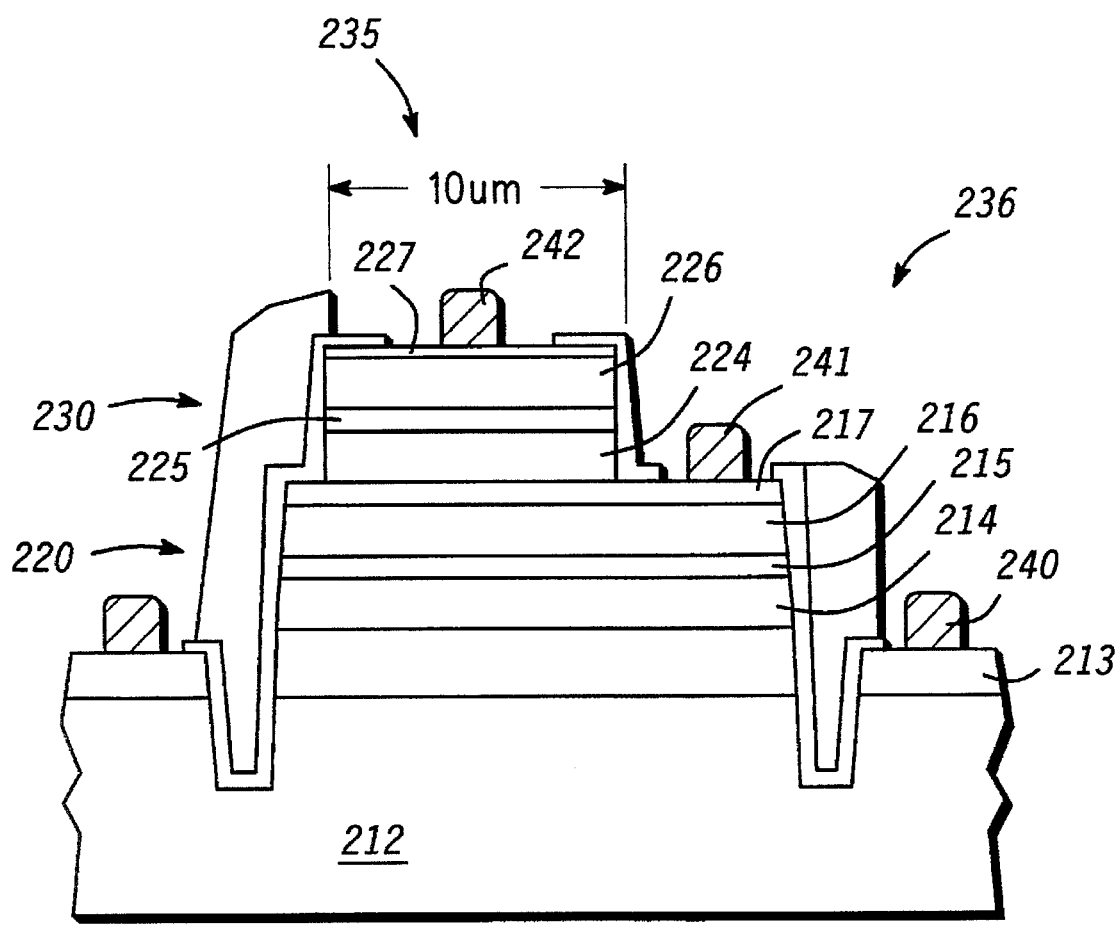
FIG. 6 is a sectional view, similar to FIG. 2, of another embodiment of a multiwavelength device incorporating the present invention.

Referring to FIG. 6, another multiwavelength light emitting diode device 210, embodying the present invention, is illustrated. Device 210 is constructed by positioning a plurality of layers of material on a substrate as described in conjunction with either of the previous two embodiments. The specific structure for device 210 illustrated has the same structure as described in conjunction with device 110 of FIG. 4. The steps utilized in the fabrication of device 210 are generally as described below.

A substrate 212 of semi-insulating GaAs with a planar surface is provided. A plurality of layers in the InGaAlP material system are epitaxially and sequentially grown on the surface of substrate 212. Layers 213–217 are the same as layers 113–117, described in conjunction with FIG. 4, and form a first LED 220. Layers 224–227 are the same as layers 124–127, described in conjunction with FIG. 4, and form a second LED 230.

A common light emitting area 235 and an adjacent contact area 236 are defined for each device 210 in the array. Mesa etching is performed around light emitting area 235 and adjacent contact area 236 of each multiwavelength light emitting diode device 210 to separate each multiwavelength light emitting diode device 210 from each adjacent multiwavelength light emitting diode device 210. Electrical contacts 240, 241 and 242 are deposited in communication with first contact layer 213, second contact layer 217 and third contact layer 227, respectively, of each multiwavelength light emitting diode device 210.

In multiwavelength light emitting diode device 210 the etching defines the devices and provides isolation of LEDs and from adjacent devices. Also, the etching provides access to buried layers for external electrical connections.

Thus, embodiments of multiwavelength light emitting diode device structure, layout, array interconnection and fabrication processes are disclosed. The multiwavelength light emitting diode device disclosed is a single device which emits two or more different peak wavelengths of light from a single aperture. This substantially reduces the amount of wafer real estate that must be utilized for each device and substantially improves the pixel density and fill factor in image generators. Further, the ability to separately excite each LED (or light spectra) is extremely valuable in display applications. Separate intensity control of each LED (or spectra) in the multiwavelength light emitting diode device allows mixing of the two spectra to provide a wide range of colors on the color chart. Also, the unique structure and fabrication process allow the plurality of LEDs to be electrically interconnected within each multiwavelength light emitting diode device so as to implement a novel addressing scheme which minimizes the I/O required to address the array.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A multiwavelength light emitting diode device comprising:

a first light emitting diode constructed to emit light of a first wavelength and a second light emitting diode constructed to emit light of a second wavelength, different than the first wavelength, the first and second light emitting diodes being stacked together and positioned to both emit light in the same direction, and one of the first and second light emitting diodes being transparent to light emitted by the other of the first and second light emitting diodes, whereby light from both of the first and second light emitting diodes is emitted through a common aperture at a surface of the device, each of the first and second light emitting diodes including an active layer of material sandwiched between two confinement layers of material and first and second electrical contacts positioned with the two confinement layers and active layer sandwiched therebetween, the first electrical contact of each of the first and second light emitting diodes being formed with a first type of conductivity, and the second electrical contact of each of the first and second light emitting diodes being formed with a second type of conductivity, the first and second light emitting diodes being stacked together with the first electrical contact of the second light emitting diode being positioned in overlying contact with the second electrical contact of the first light emitting diode, and the first electrical contact of the first light emitting diode being coupled to a common terminal and the second electrical contact of the second light emitting diode being coupled to the common terminal to electrically connect the first and second light emitting diodes in a push-pull configuration.

2. A multiwavelength light emitting diode device as claimed in claim 1 wherein the one of the first and second light emitting diodes that is transparent emits light of a shorter wavelength than other of the first and second light emitting diodes.

3. A multiwavelength light emitting diode device as claimed in claim 2 wherein the light emitted by the first and second light emitting diodes is in a visible range.

4. A multiwavelength light emitting diode device as claimed in claim 3 wherein the light emitted by the one of the first and second light emitting diodes which is transparent is in a green range and the light emitted by the other of the first and second light emitting diodes is in a red range.

5. A multiwavelength light emitting diode device comprising:

a first surface emitting, heterostructure light emitting diode including an electrically conductive first contact layer, a first confinement layer positioned on the first contact layer, a first active layer positioned on the first confinement layer, a second confinement layer positioned on the first active layer, and an electrically conductive second contact layer positioned on the second confinement layer;

a second surface emitting, heterostructure light emitting diode including an electrically conductive first contact layer, a first confinement layer positioned on the first contact layer, a first active layer positioned on the first confinement layer, a second confinement layer positioned on the first active layer, and an electrically conductive second contact layer positioned on the second confinement layer;

the first contact layers of the first and second light emitting diodes being a first conductivity type and the second contact layers of the first and second light emitting diodes being a second conductivity type;

the first electrical contact layer of the second light emitting diode being positioned on the second contact layer of the first light emitting diode, and the first contact layer of the first light emitting diode being coupled to a common terminal and the second contact layer of the second light emitting diode being coupled to the common terminal to electrically connect the first and second light emitting diodes in a push-pull configuration; and one of the first light emitting diode and the second light emitting diode being substantially transparent to light emitted by the other of the first light emitting diode and the second light emitting diode, whereby light from both of the first and second light emitting diodes is emitted through a common aperture at a surface of the device.

6. A multiwavelength light emitting diode device as claimed in claim 5 wherein the first electrical contact layer of the second light emitting diode and the second contact layer of the first light emitting diode are integrated into a single common layer.

7. A multiwavelength light emitting diode device as claimed in claim 5 wherein the active layers of the first and second light emitting diodes are formed of InAlGaP.

8. A multiwavelength light emitting diode device as claimed in claim 7 wherein the active layer of the one of the first and second light emitting diodes which is substantially transparent to light emitted by the other is formed with approximately 50% Al mole fraction and the active layer of the other of the first and second light emitting diodes is formed with approximately 0% Al mole fraction.

9. A multiwavelength light emitting diode device as claimed in claim 8 wherein the first and second confinement layers of the one of the first and second light emitting diodes which is substantially transparent to light emitted by the other are formed of material including InAlP and the first and second confinement layers of the other of the first and second light emitting diodes are formed of material including InGaAlP.

10. A multiwavelength light emitting diode device as claimed in claim 9 wherein the first and second electrical contact layers of the one of the first and second light emitting diodes which is substantially transparent to light emitted by the other and the first and second electrical contact layers of the other of the first and second light emitting diodes are formed of thin layers of material including heavily doped GaAs.

11. An array of multiwavelength light emitting diode devices comprising:

a substrate having a planar surface;

an array of devices formed on the surface of the substrate, the array being formed in rows and columns with a plurality of devices in each row and column; and each device in the array of devices including a first surface emitting, heterostructure light emitting diode including an electrically conductive first contact layer, a first confinement layer positioned on the first contact layer, a first active layer positioned on the first confinement layer, a second confinement layer positioned on the first active layer, and an electrically conductive second contact layer positioned on the second confinement layer;

a second surface emitting, heterostructure light emitting diode including an electrically conductive first contact layer, a first confinement layer positioned on the first contact layer, a first active layer positioned on the first confinement layer, a second confinement layer positioned on the first active layer, and an electrically conductive second contact layer positioned on the second confinement layer;

the first contact layers of the first and second light emitting diodes being a first conductivity type and the second contact layers of the first and second light emitting diodes being a second conductivity type;

the first electrical contact layer of the first light emitting diode being positioned on the surface of the substrate and the first electrical contact layer of the second light emitting diode being positioned on the second contact layer of the first light emitting diode, and the first contact layer of the first light emitting diode being coupled to a common terminal and the second contact layer of the second light emitting diode being coupled to the common terminal to electrically connect the first and second light emitting diodes in a push-pull configuration; and the second light emitting diode being substantially transparent to light emitted by the first light emitting diode, whereby light from both of the first and second light emitting diodes is emitted through a common aperture at a surface of the device.

12. An array of multiwavelength light emitting diode devices as claimed in claim 11 wherein the substrate is semi-insulating GaAs.

13. An array of multiwavelength light emitting diode devices as claimed in claim 11 wherein the active layers of the first and second light emitting diodes are formed of InAlGaP.

14. A multiwavelength light emitting diode device as claimed in claim 13 wherein the active layer of the second light emitting diode is formed with approximately, 50% Al mole fraction and the active layer of the first light emitting diodes is formed with approximately 0% Al mole fraction.

15. A multiwavelength light emitting diode device as claimed in claim 14 wherein the first and second confinement layers of the second light emitting diode is formed of material including InAlP and the first and second confinement layers of the first light emitting diode is formed of material including InGaAlP.

16. A multiwavelength light emitting diode device as claimed in claim 15 wherein the first and second electrical contact layers of the first and second light emitting diodes are formed of thin layers of material including heavily doped GaAs.

* * * * *